United States Patent [19]
Voss

[11] 4,001,865
[45] Jan. 4, 1977

[54] LIGHT CONTROLLABLE THYRISTOR

[75] Inventor: Peter Voss, Munich, Germany

[73] Assignee: Siemens Aktiengesellschaft, Berlin & Munich, Germany

[22] Filed: Nov. 14, 1975

[21] Appl. No.: 632,004

[30] Foreign Application Priority Data

Dec. 10, 1974 Germany .................... 2458401

[52] U.S. Cl. .................... 357/38; 357/30; 357/68; 357/86
[51] Int. Cl.² ........................ H01L 29/74
[58] Field of Search .......... 357/38, 39, 20, 86, 357/30, 68

[56] References Cited
UNITED STATES PATENTS 3,893,153   7/1975   Page et al. .................... 357/38

Primary Examiner—Andrew J. James
Assistant Examiner—Joseph Clawson, Jr.
Attorney, Agent, or Firm—Hill, Gross, Simpson, Van Santen, Steadman, Chiara & Simpson

[57] ABSTRACT

A thyristor which may be controlled by light has a semiconductor body comprising at least four zones of alternating conductivity types. The first zone forms a main emitter, the second zone forms a base having a region which is provided to be exposed to light, and having an auxiliary emitter located between the light region and the main emitter. A second auxiliary emitter is located between the first-mentioned auxiliary emitter and the main emitter. The ratio of the effective edge lengths facing the exposure region, to the second auxiliary emitter and the ratio between the effective edge lengths facing the exposure region of the main emitter on the one hand and the second auxiliary emitter on the other hand are related to one another in such a manner that, prior to the turn-on of the first auxiliary emitter, the second auxiliary emitter and subsequently the main emitter turn on.

5 Claims, 2 Drawing Figures

LIGHT CONTROLLABLE THYRISTOR

BACKGROUND OF THE INVENTION

1. Field of the Invention

The present invention relates to a thyristor which may be controlled by light and having a semiconductor body which comprises at least four zones of alternating conductivity types, of which the first zone forms a main emitter, and the second zone forms a base, having a region provided to be exposed to light and having an auxiliary emitter located between this region and the main emitter.

2. Description of the Prior Art

A thyristor of the type generally set forth above is known in the art. In this thyristor, the auxiliary thyristor which consists of an auxiliary emitter and the other zones is turned on by light and the load current of the auxiliary thyristor is then employed to turn-on the main thyristor in the same way as in thyristors which are turned on by a control current. In order to prevent a violent heating on the thyristor at turn-on, it is desirable to ignite the auxiliary thyristor from the very start over as large a surface as possible. For this purpose, the light must strike the thyristor at a high intensity and in an extremely homogenously distributed fashion. This imposes strict requirements on the quality of the light source, but nevertheless does not always lead to the desired result, since inhomogeneous conditions in the thyristor itself also influence the turn-on process. In this case, and in the event of inhomogeneous illumination, the auxiliary thyristor will only ingite over a small area, and initially the entire load current will flow through this small area causing overloading of the thyristor and possibly destruction thereof.

SUMMARY OF THE INVENTION

The object of the present invention is to provide a further development of the thyristor of the type described above, which may be ignited with light, in such a manner that even in the event of inhomogeneous illumination and inhomogeneous conditions, the thyristor ignites over a relatively large area.

A primary feature of the invention provides a second auxiliary emitter between the first-mentioned auxiliary emitter and the main emitter. The ratio of the effective edge length of the second auxiliary emitter facing the exposure region to the area of the exposure region, and the ratio of the effective edge length of the main emitter facing the exposure region to the edge length of the second auxiliary emitter are related to one another in such a manner that, prior to turn-on of the first auxiliary emitter, an ignition takes place at the second auxiliary emitter, and subsequently at the main emitter.

The above relationship between the ratios ensures that the first auxiliary thyristor which is formed from the first auxiliary emitter and the other zones of the thyristor initially operates merely as a current amplifier without actually turning on having a load current which is supplied to the second auxiliary emitter. The magnitude of this load current is such that the second auxiliary thyristor, from the start, ignites over a relatively large area. The load current of the auxiliary thyristor is then supplied in a known manner as a control current to the main thyristor. The main thyristor then also turns on over a relatively large area and the second auxiliary thyristor is extinguished.

The theory described above is based on the recognition that the turn-on of a thyristor requires a specific line current density, the value of which is approximately 0.5 A/mm emitter edge length. As initially only a zone of 100 to 300 /um width is ignited, it may be concluded that, in terms of the current density per area, required for turn-on, 1 mm emitter edge length corresponds to approximately 0.2 mm² area.

It has been proven that the first auxiliary emitter can safely be prevented from turning on before the other emitters if the ratio of the effective edge lengths of the main emitter to the second auxiliary emitter is designed to be $\geq$ 4:1, and the ratio of the effective emitter edge lengths of the first auxiliary emitter to the second auxiliary emitter is designed to be $\geq$ 1:3. Accordingly, if it is to be ensured that the turn-on of the second auxiliary emitter commences before the turn-on of the first auxiliary emitter, an emitter edge length of the second auxiliary emitter of 3 mm corresponds to at least 1 mm effective emitter edge length of the first auxiliary emitter.

Consequently, in the case of the thyristor which is controlled by light, the ratio of the effective edge lengths of the main emitter to the second auxiliary emitter is selected to be $\geq$ 4:1, whereas the ratio of the effective edge lengths of the second auxiliary emitter, measured in millimeters, to the area of the region which is to be exposed, measured in square millimeters, is $\leq$ 15:1. In order to achieve the above-quoted conditions, the second auxiliary emitter is expediently designed as a circular ring segment. The first auxiliary emitter can then be connected to a ring-shaped electrode which possesses a segment-like projection which lies opposite the second auxiliary emitter and which engages over the pn junction located between the first auxiliary emitter and the base zone.

BRIEF DESCRIPTION OF THE DRAWING

Other objects, features and advantages of the invention, its organization, construction and operation will be best understood from the following detailed description taken in conjunction with the accompanying drawing, on which.

DESCRIPTION OF THE PREFERRED EMBODIMENTS

Figure 1:
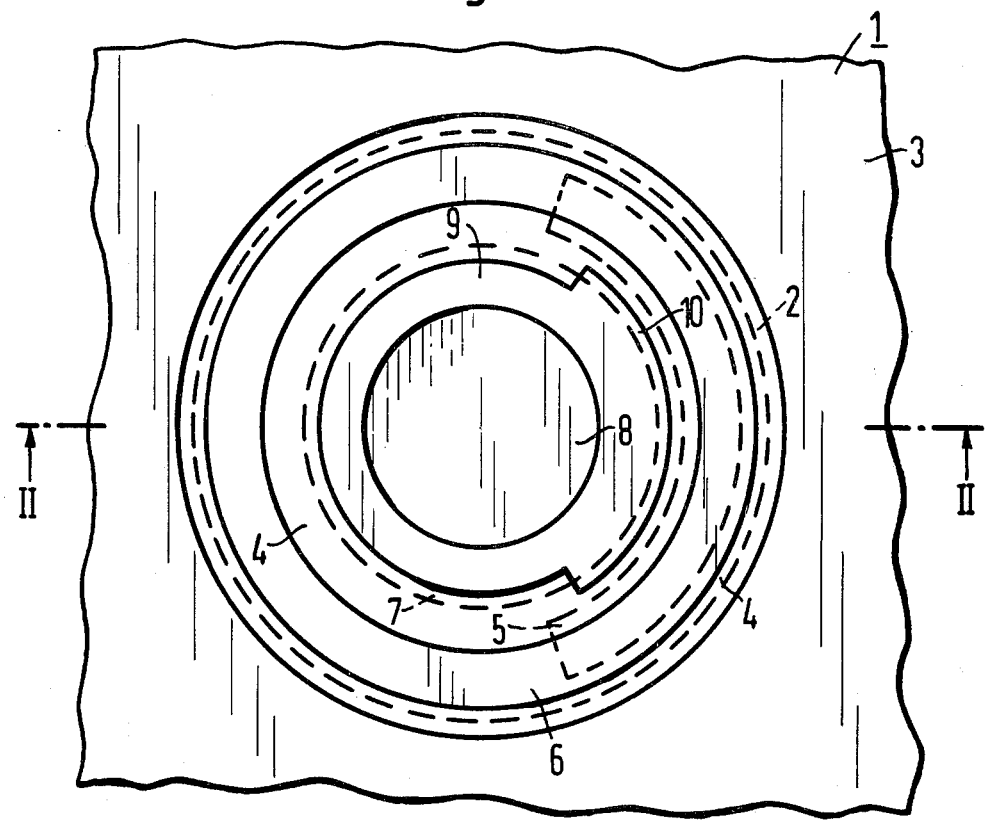
FIG. 1 is a plan view of a thyristor tablet constructed in accordance with the invention.
Figure 2:
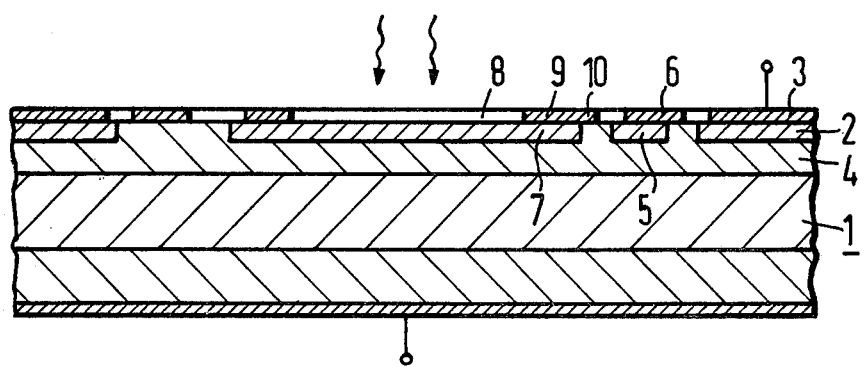
FIG. 2 is a sectional view through the thyristor tablet of FIG. 1 taken substantially along the line II—II.

In FIGS. 1 and 2 a thyristor tablet 1 is illustrated as comprising a main emitter 2, a first auxiliary emitter 7 and a second auxiliary emitter 5. The main emitter 2 is connected to a main emitter electrode 3, while the first auxiliary emitter 7 is connected to a basically ring-shaped auxiliary emitter electrode 9, and the second auxiliary emitter 5 is connected to a ring-shaped auxiliary emitter electrode 6. The auxiliary emitter electrode 9 encloses a region 8 which is to be exposed to light. The auxiliary emitter electrode 9 possesses a segment-like projection 10 which covers a pn junction located between the first auxiliary emitter 7 and a base zone 4. The auxiliary emitter electrode 6 bridges the pn junction located between the second auxiliary emitter 5 and the base zone 4 on the side facing the main emitter 2.

If the region 8, which is intended to be exposed to light, is subjected to light irradiation, a photo current is formed which, amplified by the first auxiliary thyristor, flows to the auxiliary emitter electrode 9 and from the auxiliary electrode 9 via the segment shaped projection 10 to the second auxiliary emitter 5. This current serves as a control current for the second auxiliary thyristor and turns on the same. The load current flowing through the second auxiliary emitter 5 flows across the second auxiliary electrode 6 to the main emitter 2, as a result of which the turn-on of the main thyristor is initiated.

The effective lengths of the emitter edges, facing the region 8, of the main thyristor to the second auxiliary thyristor here possesses a ratio of $\geq$ 4:1. This ratio is fundamentally achieved in that the second auxiliary emitter 6 lies opposite the projection 10 of the auxiliary emitter electrode 9, which projection is in the form of a segment of a circle. The effective edge length of the emitter edge located between the zones 4 and 5 is fundamentally determined by the length of the segment-like projection 10 as the load current emanating from the first auxiliary emitter 7 is fundamentally propagated only in a radial direction from the segment like projection 10. The effective edge length of the emitter edge located between the main emitter 2 and the base zone 4, on the other hand, is equal to the actual length as the load current emanating from the second auxiliary emitter 5 is uniformly distributed over the second auxiliary electrode 6. It will be clear that the ratio of the effective emitter edge lengths of the main thyristor to the second auxiliary thyristor is $\geq$ 4:1, and this case is approximately 5:1. The region 8 possesses an area, measured in square millimeters, which is $\geq$ 1/15 of the effective edge length of the second auxiliary emitter, measured in millimeters. The photo current produced as a result of the exposure of the region 8 is then insufficient to turn on the first auxiliary thyristor before the turn-on of the second auxiliary thyristor and the main thyristor. The turn-on delay time of the first auxiliary thyristor is under these conditions, at any rate, greater than the ignition delay time of the second auxiliary thyristor, due to the aforementioned dimensioning, so that the first auxiliary thyristor operates merely as a current amplifier until the second auxiliary thyristor turns on. On the expiration of the turn-on delay time for the second auxiliary thyristor, the second auxiliary thyristor turns on, the absolute value of the turn-on delay time being dependent upon the degree of the light exposure and, thus, upon the strength of the photo current. As, however, the absolute value of the turn-on delay time of the first auxiliary thyristor is also dependent upon the degree of the exposure to light, a staggered ignition of the various thyristor systems in the desired manner is always ensured.

The aforementioned specific ratios apply to thyristors which have been doped and dimensioned in the conventional manner. However, all thyristors, irrespective of their dimensions, are governed by the general principle that the turn-on of the second auxiliary thyristor must take place before the turn-on of the first auxiliary thyristor and before the turn-on of the main thyristor.

One skilled in the art can easily check whether a thyristor satisfies these conditions by means of potential probe measurements through the utilization of an oscillograph, in which case the time curve of the voltage drops along the silicon surface is traced. The load current which flows immediately after turn-on gives rise to drastic voltage drops above the non-contacted emitter components 5 and 2, and in particular in those zones of the p base 4 which are close to the surface. For example, if the arrangement ignites in the desired manner at the inner edge of the emitter 5 of the second auxiliary thyristor, the current flowing to all sides produces a positive voltage drop both to the electrode 9 and to the electrode 6. The voltage drop between the electrode 6 and the edge of the auxiliary main emitter 2 is also positive. If, on the other hand, the arrangement turns on in the first auxiliary thyristor, the voltage drop from the electrode 9 to the edge of the emitter 5 is positive. The other voltage drops retain their polarities. If the arrangement turns on at the inner edge of the main emitter 2, the voltage is inverted on the path from the electrode 6 to the edge of the emitter 2. It can always be ensured that the second auxiliary thyristor turns on first by a suitable increase in or reduction in the ratios or the areas and the emitter edge lengths.

The region 8 which is to be exposed to light can also be smaller than the area bounded by the inner edge of the first auxiliary emitter electrode 9. This will be the case, for example, when the light is coupled by way of a fibre optic arranged in the zone 7.

Although I have described my invention by reference to specific examples, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A light controlled thyristor comprising
   a semiconductor body including at least four zones of alternate types of conductivity, and a light exposure region;
   a first of said four zones being of one conductivity type and constituting a base zone carrying the other three zones,
   a second of said zones constituting a main emitter having an edge facing said exposure region,
   a third of said zones constituting a first auxiliary emitter and including said exposure region,
   the fourth of said zones located between said second and third zones and constituting a second auxiliary emitter having edges facing said main emitter and said exposure region, PN junctions being formed between each of said emitters and said first zone, effective edge lengths of said PN junctions being defined as those portions of the PN junction which lie opposite electrodes in contact with said first zone
   the ratio of the effective edge length of said second auxiliary emitter to the area of said exposure region and the ratio of the effective edge length of the main emitter to the edge length of the second auxiliary emitter selected to cause turn-on at said second auxiliary electrode and subsequently at said main electrode prior to turn-on at said first auxiliary electrode upon illumination of said exposure region.

2. The thyristor of claim 1, wherein the ratio of the effective edge length of said second auxiliary emitter to the area of said exposure region is $\leq$ 15.1, and the ratio of the effective edge lengths of the main emitter to the second auxiliary emitter is $\geq$ 4.1.

3. The thyristor of claim 1, wherein said fourth zone which constitutes said second auxiliary emitter is in the form of a segment of a circular ring.

4. The thyristor of claim 1, comprising a ring-shaped electrode covering said third zone which constitutes said first auxiliary emitter, said ring-shaped electrode including a segment-shaped projection extending toward said fourth zone which constitutes said second auxiliary emitter and over the pn junction located between said first and third zones which constitute said base and said first auxiliary emitter, respectively.

5. A light controlled thyristor structure comprising: a common base;

a main thyristor, including a main emitter carried by said base;

a first auxiliary thyristor, including a first auxiliary emitter carried by said base, and responsive to light to produce a photo current and amplify the same as a control current;

a second auxiliary thyristor, including a second auxiliary emitter carried by said base between said main and first auxiliary electrodes to receive the control current to cause turn-on of said second auxiliary thyristor and produce a current flow to said main emitter to cause turn-on of said main thyristor.

* * * * *